United States Patent
Ho

(10) Patent No.: US 11,711,926 B2
(45) Date of Patent: Jul. 25, 2023

(54) MEMORY ARRAY AND MEMORY STRUCTURE

(71) Applicant: MACRONIX International Co., Ltd., Hsinchu (TW)

(72) Inventor: Hsin-Yi Ho, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 350 days.

(21) Appl. No.: 17/026,036

(22) Filed: Sep. 18, 2020

(65) Prior Publication Data

US 2022/0093686 A1    Mar. 24, 2022

(51) Int. Cl.
*H10B 63/00* (2023.01)
*H10N 70/20* (2023.01)

(52) U.S. Cl.
CPC ............ *H10B 63/80* (2023.02); *H10B 63/20* (2023.02); *H10B 63/30* (2023.02); *H10N 70/231* (2023.02)

(58) Field of Classification Search
CPC .......................... H01L 27/2436; H10B 63/20
See application file for complete search history.

(56) References Cited

U.S. PATENT DOCUMENTS

| | | | |
|---|---|---|---|
| 2008/0037317 A1* | 2/2008 | Liu | G11C 13/004 365/163 |
| 2013/0336053 A1 | 12/2013 | Scoville et al. | |
| 2020/0227476 A1* | 7/2020 | Tomita | H01L 45/1253 |
| 2021/0296583 A1* | 9/2021 | Ode | H01L 45/1233 |

OTHER PUBLICATIONS

"Office Action of Taiwan Counterpart Application", dated Feb. 9, 2021, p. 1-p. 8.

* cited by examiner

*Primary Examiner* — Mounir S Amer
(74) *Attorney, Agent, or Firm* — J.C. Patents

(57) ABSTRACT

A memory array and structure are provided. The array includes driving elements arranged in array; memory cells arranged in array and respectively corresponding to the driving elements, where one end of each memory cell is coupled to a first end of the corresponding driving element; word lines and bit lines arranged to intersect with each other, where each word lines is coupled to control ends of the driving elements in the same word line, and each bit line is respectively coupled to the other ends of the memory cells. For each word line, the first end of one driving element is connected to the first end of at least one other driving element in the same word line by a metal line, so as to form share driving elements.

17 Claims, 8 Drawing Sheets

MEMORY ARRAY AND MEMORY STRUCTURE

TECHNICAL FIELD

The present invention relates to a memory structure, and particularly relates to a phase change memory array and phase change memory structure.

DESCRIPTION OF RELATED ART

Phase change memory (PCM) uses changes in the phase of a material to achieve the characteristics of the memory. The phase change memory has the characteristics of small size and long storage time, and can also match the current semiconductor manufacturing technology.

When the phase change memory is used in some specific applications, for example, the application can meet the requirements of automotive electronics, and the reset current of the specific phase change memory material is very high. In general, the channel width of drivers such as MOS transistors can be made wider to meet the needs for large currents. However, in this case, the size of the unit cell will also increase accordingly. This is contrary to the current trend of technology development towards miniaturization.

Therefore, in some specific applications of PCM, how to maintain or reduce the size of the memory and provide a large current for the operation of the memory cell is the direction in this technical field.

SUMMARY

In view of the above description, according to one embodiment of the disclosure, a memory array is provided. The memory array comprises a plurality of driving elements, arranged in an array with a plurality of rows and a plurality of columns; a plurality of memory cells, arranged in an array with a plurality of rows and a plurality of columns and respectively corresponding to the plurality of driving elements, wherein one end of each of the plurality of memory cells is coupled to a first end of the corresponding driving element; and a plurality of word lines and a plurality of bit lines, arranged to intersect with each other, wherein each of the plurality of word lines is respectively coupled to control ends of the plurality of driving elements in the same row, and each of the plurality of bit lines is respectively coupled to the other ends of the plurality of memory cells. For each of the plurality of word lines, the first end of one of the plurality of driving elements is connected to the first end of at least one other driving element in the same row by a metal line, so as to form share driving elements.

In one embodiment, the metal line is one of metal lines in an interconnection between the memory cell and the first end of the corresponding driving element.

In one embodiment, the driving elements of the share driving elements are adjacent.

In one embodiment, a second end of each of the plurality of driving elements is grounded.

In one embodiment, each of the plurality of driving elements is a metal oxide semiconductor transistor, and the first end and the second end are the first and second source-drains, and the control end is a gate.

In one embodiment, the memory array further comprises a plurality of unidirectional elements corresponding to the plurality of memory cells, and each of the plurality of unidirectional elements is coupled between the other end of the corresponding memory cell and the first end of the corresponding driving element.

In one embodiment, the plurality of unidirectional elements are diodes, an anode of the diode is coupled to the other end of the corresponding memory cell, and a cathode of the diode is coupled to the first end of the corresponding driving element.

In one embodiment, each of the memory cells is a variable resistance element made of a phase change material.

In one embodiment, each of the plurality of memory cells is driven by the driving elements in the same column on two adjacent word lines.

According to another embodiment, a memory structure is provided. The memory structure comprises a first driving element and a second driving element, located on a substrate; a word line, connecting a first control end of the first driving element and a second control end of the second driving element; a first memory cell and a second memory cell, respectively located above the first driving element and the second driving element; a first interconnection, located between the substrate and the first memory cell, and connected to a first end of the first driving element and the first memory cell; and a second interconnection, located between the substrate and the second memory cell, and connected to a first end of the second driving element and the second memory cell. The first interconnection is connected to the second interconnection, and a second end of the first driving element and a second end of the second driving element are grounded.

In one embodiment, one of metal lines of the first interconnection is connected to one of metal lines of the second interconnection.

In one embodiment, the first interconnection and the second interconnection are connected by the metal line on the same layer.

In one embodiment, the metal line of the first interconnection closest to the first memory cell is connected to the metal line of the second interconnection line closest to the second memory cell.

In one embodiment, the memory structure further comprises a first bit line and a second bit line located on the first memory cell and the second cell, respectively, and respectively connected to the first memory cell and the second memory cell.

In one embodiment, the memory structure further comprises a first unidirectional element, coupled between the first memory cell and the metal line connecting the first interconnection and the second interconnection; and a second unidirectional element, coupled between the second memory cell and the metal line connecting the first interconnection and the second interconnection.

In one embodiment, the first and second unidirectional elements are diodes. In one embodiment, the first and second memory cells are variable resistance elements made of phase change materials.

In one embodiment, the first and second driving elements are metal oxide semiconductor transistors, and the first ends and the second ends of the first and second driving elements are source-drains, and the control ends of the first and second driving elements are gates.

In summary, the present disclosure utilizes the concept of share driving elements (such as transistors) for the memory cell, which uses any layer of metal lines in the interconnection under the memory cell to connect the transistors in parallel. In this way, there is no need to increase the size of the transistor, nor the size of the memory cell, nor the size of the overall memory array, so that a higher write current can be provided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
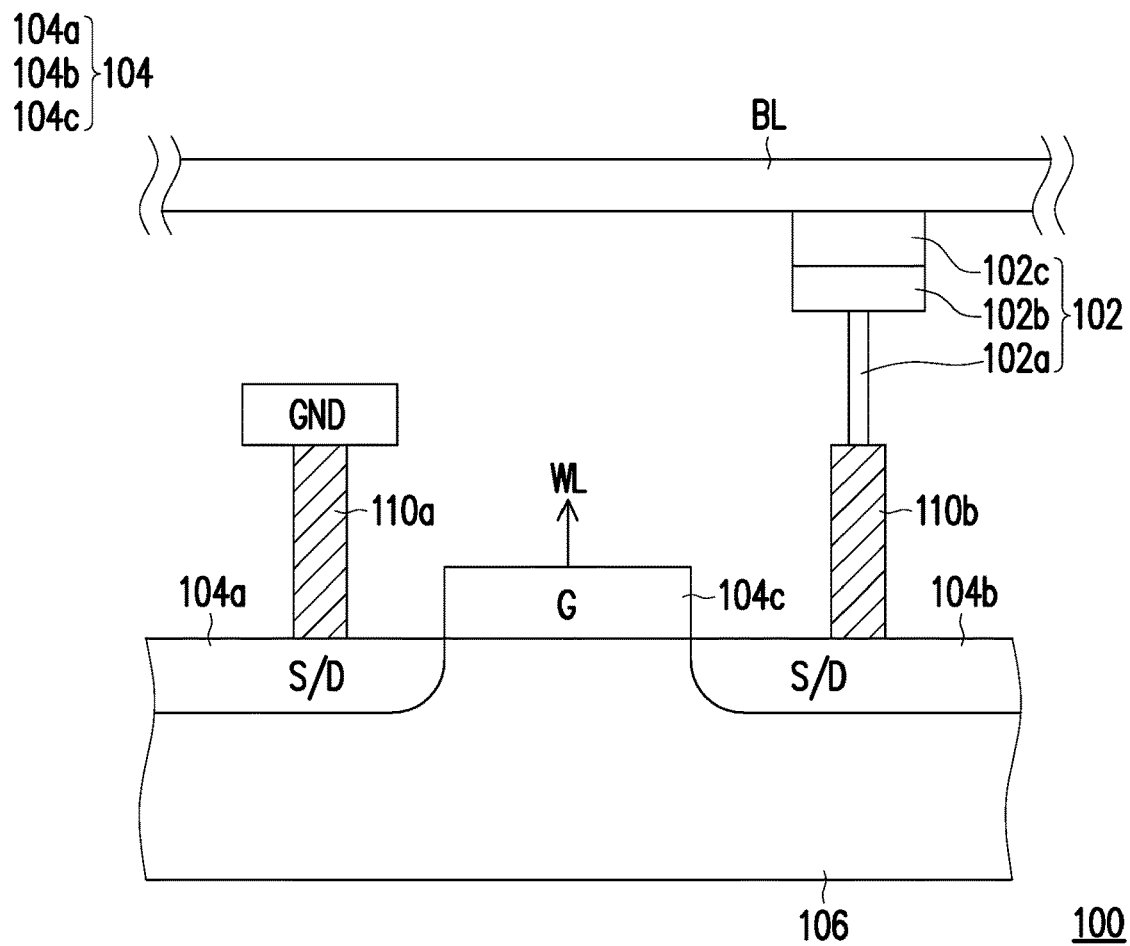
FIG. 1A shows a schematic diagram of a cross-sectional structure of a phase change memory unit.

FIG. 1A shows a schematic diagram of a cross-sectional structure of a phase change memory unit. As shown in FIG. 1A, the phase change memory unit 100 comprises a memory cell (variable resistor element) 102 and a driving element 104. The memory cell 102 is made of phase change material, and the driving element 104 may be a switching element, such as bipolar junction transistor (BJT), metal oxide semiconductor (MOS) transistor, field effect transistor (FET), diode, etc. A MOS transistor is used as an example for the driving element 104 in the following embodiment.

As shown in the cross-sectional view of FIG. 1, the phase change memory unit 100 includes a MOS transistor 104 with source-drains 104a, 104b and a gate 104c formed on a semiconductor substrate 106. In a phase change memory array, a row of phase change memory units 100 are connected by a word line WL, and the word line WL is connected to the gate 104c of the MOS transistor 104 of each phase change memory unit 100. One of the source-drain 104a of the MOS transistor 104 is connected to a ground GND via the contact window 110a.

The memory cell 102 is a variable resistance element made of phase change material, which may include a lower electrode 102a, a phase change material layer 102b, and a top electrode 102c. The memory cell 102 can be connected to the other source-drain 104b of the MOS transistor 104 via the bottom electrode 102a and the contact window 110b. The memory cell 102 may also be connected to the bit line BL via the top electrode 102c. Thereby, the source-drain 104b of the MOS transistor of the phase change memory unit 100 located in the same column of the phase change memory array may be connected to the same bit line BL.

Figure 1B:
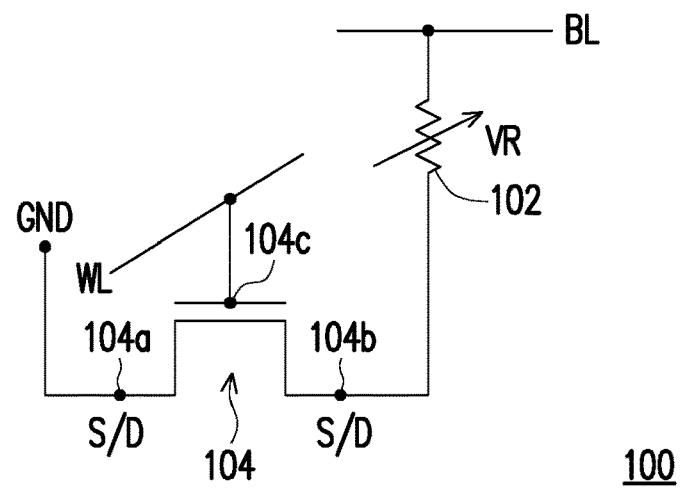
FIG. 1B is an equivalent circuit diagram of the phase change memory unit of FIG. 1A.

FIG. 1B is an equivalent circuit diagram of the phase change memory unit of FIG. 1A. As shown in FIG. 1B, the phase change memory unit 100 has a configuration of 1 transistor and 1 resistor (1T1R), and includes a MOS transistor 104 and a memory cell (VR) 102. The memory cell (VR) 102 may change the resistance value based on the voltage applied between the top electrode 102c and the bottom electrode 102a, so as to implement the function of storing different values (0 or 1). One end of the memory cell (VR) 102 is connected to the bit line BL, and the gate 104c of the MOS transistor 104 is connected to the word line WL. The source-drain 104a of the MOS transistor 104 is coupled to the ground GND and the other source-drain 104b is coupled to the other end of the memory cell (VR) 102. On and off of the MOS transistor 104 may be controlled by applying proper voltage to the word line WL, and thus operations such as programming (writing), erasing, and reading can be performed on the memory cell 102. In general, a plurality of phase change memory units 100 will be arranged in a form of array including a plurality of rows and a plurality of columns, the gates of the MOS transistors of the phase change memory units 100 in the same row connected to the same word line WL, and one of the source-drains of the MOS transistors of the phase change memory units 100 in the same column is connected to the same bit line BL via the memory cell 102.

Figure 2A:
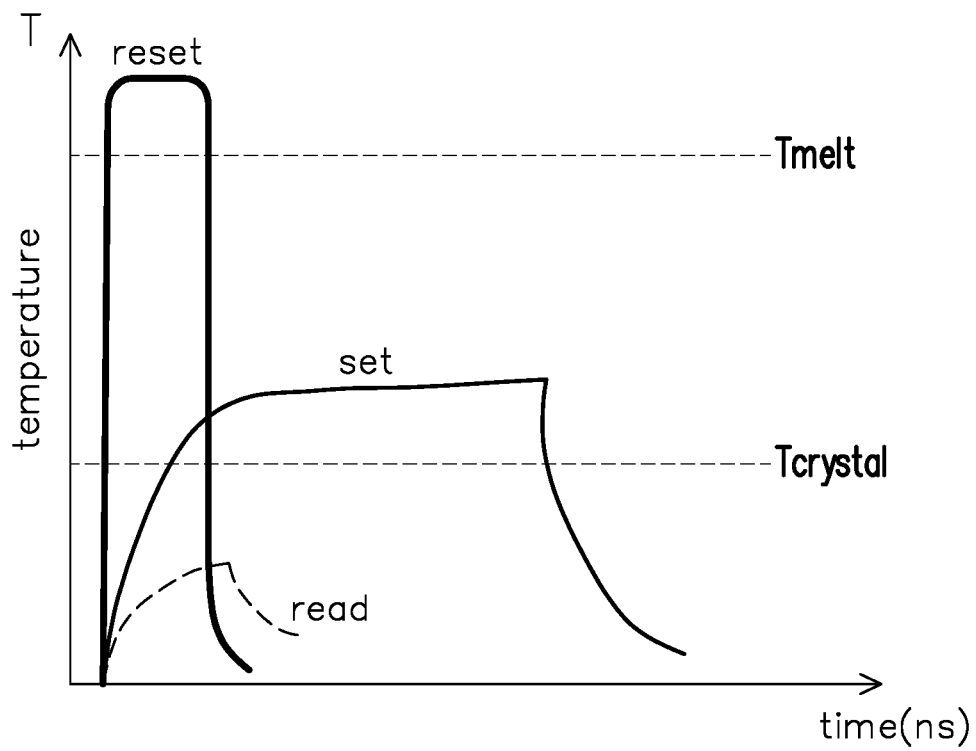
FIG. 2A shows a time-temperature diagram of the operation conditions of the phase change memory cell.
Figure 2B:
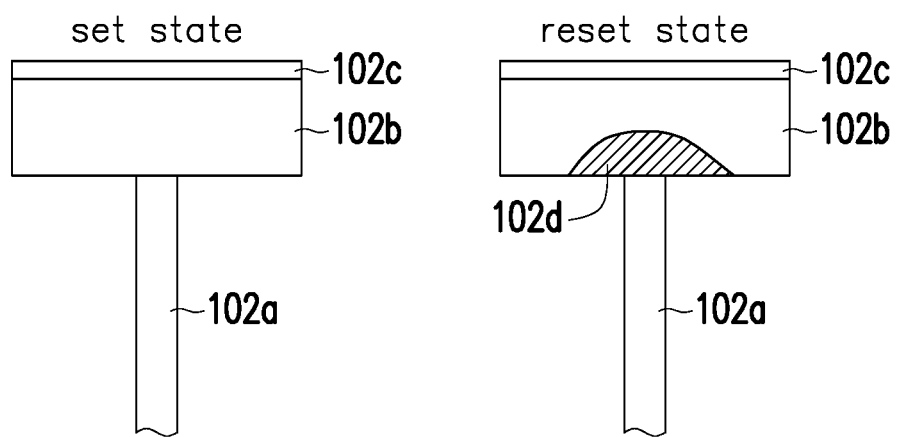
FIG. 2B is an explanatory diagram illustrating the set and reset states of the phase change memory cell.

FIG. 2A is a schematic time-temperature diagram of the operation conditions of the phase change memory, and FIG. 2B is a diagram illustrating the set and reset states of the memory cell. As shown in FIG. 2A and the left part of FIG. 2B, as a voltage applied to the memory cell 102 increases, the temperature of the phase change material layer 102b also increases. When the temperature T rises with time and exceeds the crystallization temperature Tcrystal and is lower than the melting temperature Tmelt, the phase change material layer 102b will become a crystalline state. At this time, the phase change material layer 102b is in a low resistance state, i.e., a SET state. When the voltage applied to the memory cell 102 exceeds the melting temperature Tmelt, as shown in FIG. 2A and the right part of FIG. 2B, the phase change material layer 102b starts to transform from a crystalline state to an amorphous state, and an amorphous block 102d is created. At this time, the phase change material layer 102b is in a high resistance state, i.e., a reset state. By controlling the phase change material layer 102b into the set state or the reset state, a value of "0" or "1" can be stored in the memory cell 102. In addition, as shown in FIG. 2A, when the value stored in the memory cell 102 is to be read, a read voltage can be applied to make the temperature T of the phase change material layer 102b below the crystallization temperature Tcrystal, so as to read the memory cell 102.

Figure 3A:
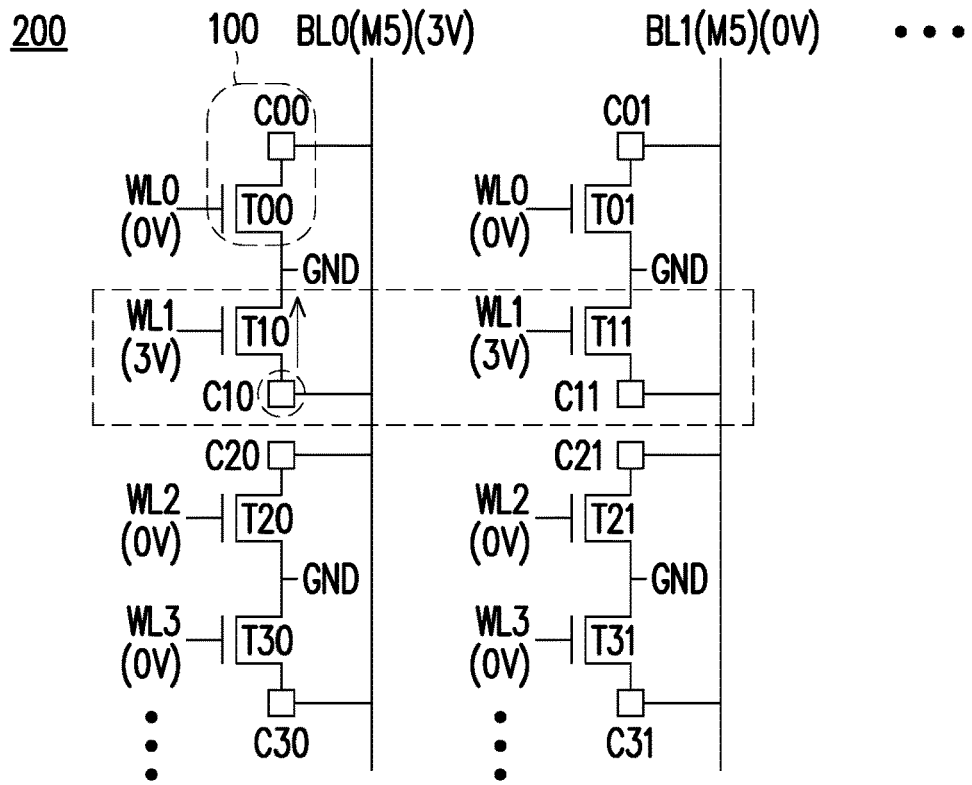
FIGS. 3A and 3B are schematic diagrams showing the writing operation of a phase change memory array with 1T1R configuration.
Figure 3B:
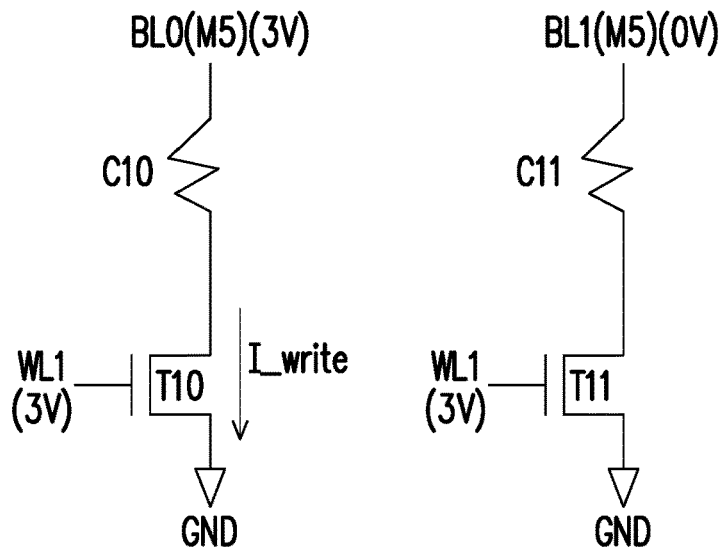

FIGS. 3A and 3B are schematic diagrams showing the writing operation of a phase change memory array with a general 1T1R structure, and FIG. 3B is depicted to illustrate the writing operation with reference to a dashed part in FIG. 3A. As shown in FIGS. 3A and 3B, the PCM memory array 200 includes a plurality of memory cells Cij arranged in rows and columns, in which i is an integer from 0 to n−1, and j is an integer from 0 to m−1. In FIG. 3A, only memory cell C00, C01, C10, C11, C20, C21, C30, and C31 are illustrated. Take the memory cell C10 as an example, one end of the memory cell C10 is coupled to a bit line BL0, and the other end of the memory cell C10 is coupled to one of the source-drains of the transistor T10. The gate of the transistor T10 is coupled to the word line WL1, and the other source-drain of the transistor T10 is coupled to the ground GND. Each phase change memory unit 100 of the PCM memory array 200 is constructed in a 1T1R configuration, i.e., including a transistor (driving element) and a variable resistor (formed by a phase change material layer).

As shown in FIG. 3A, the PCM memory array 200 may comprise a plurality of word lines WL0~WLn−1 in the row direction and a plurality of bit lines BL0~BLm−1 in the column direction. The phase change memory units 100 are respectively arranged at the intersections of the word lines WL0~WLn−1 and the bit lines BL0~BLm−1. One source-drain of the transistor Tij in the same column is coupled to the bit line BLj (j=0~m−1) via the memory cell Cij. The gates of the transistors Tij in the same row are coupled to the word line WLi (i=0~n−1).

As shown in FIG. 3B, a schematic diagram when the writing operation is performed on the memory cell C10 indicated by the dashed frame in FIG. 3A is shown. When the writing operation is performed on the memory cell C10, the word line WL1 is applied with a write voltage of, for example, 3V, the other word lines WL0, WL2, WL3, ..., WLn−1 are applied with a voltage of 0V, in addition, the bit line BL0 is applied with, for example, a voltage of 3V, while the other lines BL1, BL2, ..., BLm−1 are applied with a voltage of V. Thereby, the memory cell C10 can be selected as the writing target. Under this situation, the transistor T10 is turned on to perform the writing operation on the memory cell C10, and the transistor T10 will also generate a corresponding write current I_write in the channel of the transistor T10, and the write current I_write flows from the memory cell C10 through the channel of the transistor T10, and then to the ground GND.

Figure 4A:
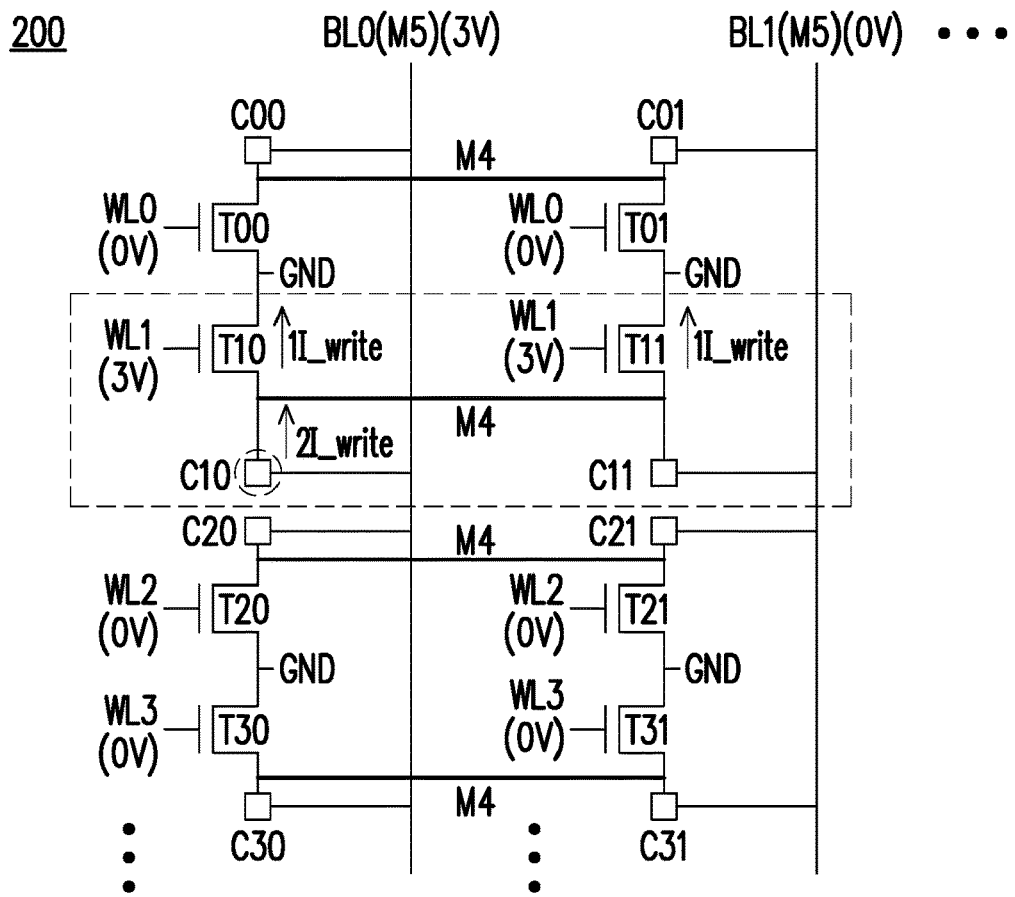
FIGS. 4A and 4B are schematic diagrams showing the writing operation of the phase change memory array with 1T1R configuration according to the embodiment of the disclosure.
Figure 4B:
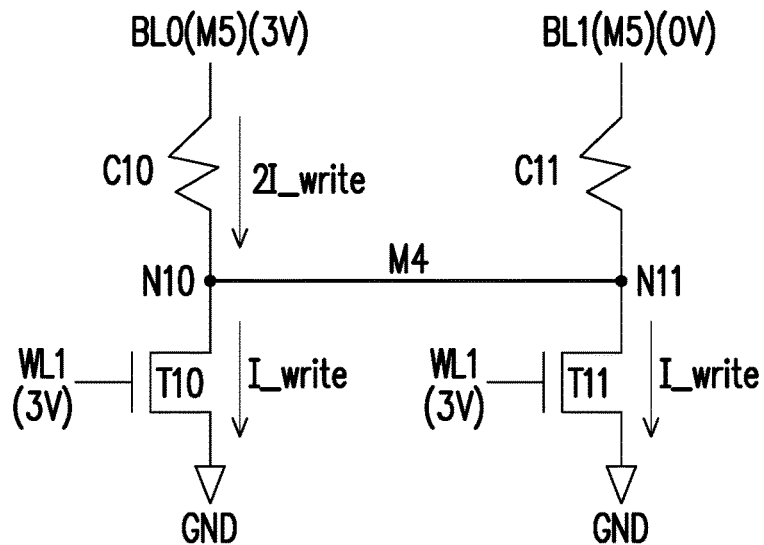

FIGS. 4A and 4B are schematic diagrams showing the writing operation of the phase change memory array with the 1T1R configuration according to the embodiment. As shown in FIG. 4A, the difference between the phase change memory array with the 1T1R configuration of the embodiment and FIG. 3A is in that one of the source-drain (non-grounded ends) of the transistors T10 and T11 is shorted or connected to each other.

As shown in FIG. 4A, the source-drain of the transistor T10 coupled to the memory cell C10 and the source-drain of the transistor T11 coupled to the memory cell C11, in which the transistors T10, T11 are coupled to the same word line WL1, are connected to each other. Here, the present embodiment uses metal lines (interconnection) below the memory cells C10 and C11 of the memory array for the aforementioned connection. In this embodiment, for example, the connection is implemented by the metal line of the fourth layer (M4) of the interconnection. Similarly, the source-drain (coupled to the memory cell C00) of the transistor T00 and the source-drain (coupled to the memory cell C01) of the transistor T01, which are coupled to the same word line WL0, are also connected to each other by a metal line M4. Also, the source-drain (coupled to the memory cell C20) of the transistor T20 and the source-drain (coupled to the memory cell C210) of the transistor T21, which are coupled to the same word line WL2, are also connected to each other by a metal line M4. The other transistors have the same configurations.

As shown in FIG. 4A, when the writing operation is performed on the memory cell C10, the word line WL1 is applied with a write voltage of, for example, 3V, the other word lines WL0, WL2, WL3, ..., WLn−1 are applied with a voltage of 0V, in addition, the bit line BL0 is applied with, for example, a voltage of 3V, and the other bit lines BL1, BL2, ..., BLm−1 are applied with a voltage of V. In this manner, the memory cell C10 can be selected as the writing target. In this case, the transistor T10 is turned on to perform the writing operation on the memory cell C10, and the transistor T10 will also generate a corresponding write current I_write in the channel of the transistor T10. In addition, because the nodes N10 and N11 is be connected to each other through the metal line (M4), an equal write current I_write will also flow through the channel of the transistor T11. Therefore, under the configuration of the embodiment, when the memory cell C10 is selected as the write target, a doubled write current 2I_write will occur by using the unselected transistor T11 on the same word line WL1 as a share transistor. Namely, both the transistors T10, T11 are used as the driving element for the memory cell C10.

In the embodiment, the adjacent transistors T10 and T11 of the same word line WL1 are short-circuited or connected by the metal line M4 and the memory cell C01 is not driven by the transistor T11 when the bit line BL1 coupled to the transistor T11 is applied with a voltage of 0V, and therefore, it is equivalent to that the memory cell C10 is simultaneously coupled to the transistors T10 and T11. In this way, since the memory cell C10 is driven by the two transistors T10 and T11, a doubled writing current can be provided.

As mentioned above, according to the configuration of the phase change memory array of the embodiment, the size of the transistor (driving element) is not increased to increase the write current of the memory cell C10, but uses adjacent unselected transistor on the same word line to serve as an additional driving element. Therefore, without increasing the size of the transistor and without increasing the overall area of the array, the write current for the memory cell can be increased (doubled in the embodiment).

In addition, in the above example, the adjacent transistors on the same word line are used as the share transistors. However, the embodiment is not limited to this configuration. For example, the transistors T1j (j=0~m−1) are coupled to the word line WL1, and during the design, a suitable transistor can be selected as the share transistor, i.e., any one of the transistors T1j (j=0~m−1). According to the above description, for example, if the transistor T13 and the transistor T10 are used as the share transistors, when the memory cell C10 is to written, the transistor T13 will also drive the memory cell C10 in addition to the transistor T10 driving the memory cell C10, so as to increase the write current. Similarly, when the writing operation is performed on the memory cell C13, the transistor T10 will also drive the memory cell C13 in addition to the transistor T13 driving the memory cell C13.

In addition, in the above example, although two transistors (such as the transistors T10 and T11) are used as the share transistors, but the number of the share transistors is not limited. Namely, according to another embodiment, one (such as T11) or more (such as T11, T12, etc.) can be used as the share transistors. In short, as long as the transistors formed on the same word line, regardless of the number and position, the transistors can be suitably chosen as the share transistor. In this way, the write current can be further increased.

In addition, the configurations of the share transistors on the word lines WL0, WL2, WL3, ... WLn−1 are the same as that on the above-mentioned word line WL1. Those skilled in the art can understand the configurations of other parts from the above description. Thus, their descriptions will be omitted.

Figure 4C:
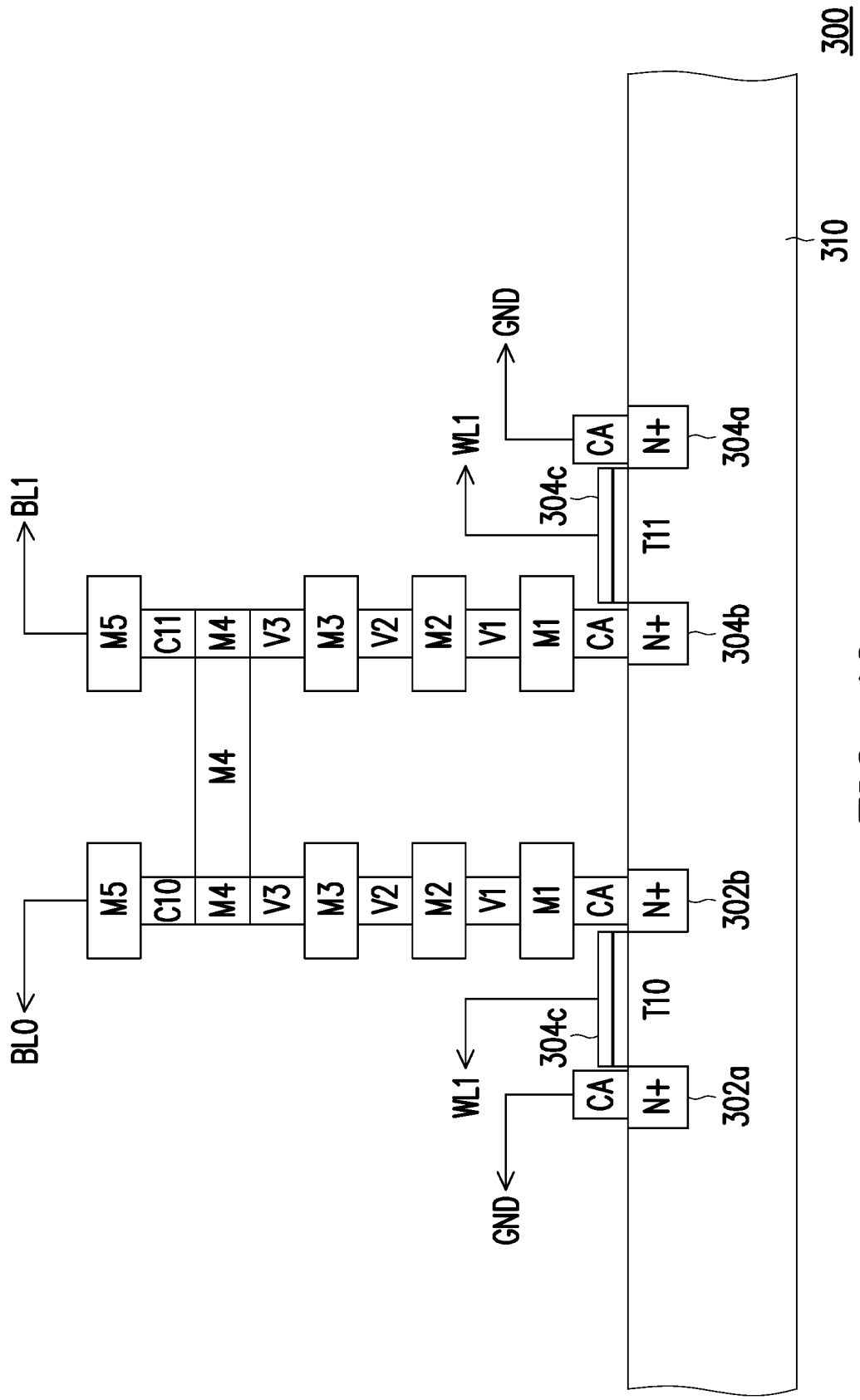
FIG. 4C is a schematic cross-sectional structure diagram of FIG. 4A including memory cells C10, C22, transistors T10, T11, etc.

FIG. 4C is a schematic cross-sectional structure diagram of FIG. 4A including memory cells C10, C22, transistors T10, T11, etc. Here, FIG. 4C is only an exemplary structure diagram. As long as the operations described in FIG. 4A can be implemented, the detailed structure can be modified according to needs. In the phase change memory structure 300 shown in FIG. 4C, a transistor (first driving element) T10 and a transistor (second driving element) T11 as shown in FIG. 4A are formed on a semiconductor substrate 310. The semiconductor substrate 310, for example, may be a P-type substrate. The transistors T10 and T11, for example, may be MOS transistors, and of course, can also be other elements with the same or similar functions. In this example, the transistor T10 includes source-drains 302a, 302b (second and first ends), and a gate (control end) 302c, and the transistor T11 includes source-drains (second and first ends) 304a, 304b, and a gate (control end) 304c. In this example, the gate 302c of the transistor T10 and the gate 304c of the T11 are both coupled to the same word line WL1, and the other word lines WL0, WL2, WL3, . . . , WLn−1 have the same structure.

In addition, as shown in FIG. 4C, the memory cell (first memory cell) C10 and the memory cell (second memory cell) C11 are respectively arranged above the transistor T10 and the transistor T11. A first interconnection (for example, formed by metal lines M1, M2, M3, and M4) is located between the substrate 310 and the memory cell C10, and connects the source-drain region 302b of the transistor T10 and the memory cell C10. A second interconnection (for example, formed by metal lines M1, M2, M3, M4) is located between the substrate 310 and the memory cell C11, and connects the source-drain region 304b of the transistor T11 and the memory cell C11. The other source-drain region 302a of the transistor T10 and the other source-drain region 304a of the transistor T11 are respectively coupled to the ground GND via the contact windows CA. In addition, according to the embodiment, the first interconnection under the first memory cell C10 and the second interconnection under the second memory cell C11 are further connected to each other.

In the above structure, the connection between the first interconnection and the second interconnection can be implemented by using any metal lines (M1~M4) of the first interconnection and any metal lines (M1~M4) of the second interconnection. In this example, the fourth layer of metal line M4 is used for the connection, i.e., the metal lines on the same layer of the first interconnection and the second interconnection are used for connection, and the metal line M4 (the fourth layer) of the first interconnection line closest to the memory cell C10 is connected to the metal line M4 of the second interconnection line closest to the memory cell C11.

In other words, as long as the metal lines M1, M2, M3, and M4 located below the memory cells C10 and C11, these metal lines M1~M4 can be used to connect the first and second interconnections. The metal lines M1~M4 on each layer can be connected by vias V1~V3. The metal line M1 of the first interconnection can be connected to the source-drain 302b of the transistor T10 through the contact window CA, and the metal line M1 of the second interconnection can be connected to the source-drain 304b of the transistor T11 through the contact window CA.

In addition, the memory cell C10 can be connected to the bit line BL0 through the metal line M5 on a layer upper than the memory cell C10, and the memory cell C11 can be connected to the bit line BL1 through the metal line M5 on a layer upper than the memory cell C11. Therefore, through the above structure, for example, when the writing operation is performed on the memory cell C10, in addition to the transistor T10 driving the memory cell C10, the transistor T11 can also be additionally used for driving the memory cell C10. Therefore, without increasing the size of the transistor and the size of the overall array, the writing current for writing the memory cell C10 can be increased.

In the example described above, the adjacent transistors T10 and T11 on the same word line WL1 (the respective source-drain regions are connected to the bit lines BL0 and BL1 respectively) are connected together. However, the present embodiment is not limited to this configuration, other non-adjacent transistors on the same word line, such as T12, T13, T14, etc., can be used as the share transistor, i.e., the transistor connected in parallel with the transistor T10. In addition, the number of the transistors connected in parallel with the transistor T10 is not limited to one, and the number of the share transistors can be set according to the needs, so as to achieve the required writing current.

In summary, the memory array comprises a plurality of driving elements (such as the transistors T10, T11, etc.), arranged in an array with a plurality of rows and a plurality of columns; a plurality of memory cells (such as the memory cells C10, C11, etc.), arranged in an array with a plurality of rows and a plurality of columns and respectively corresponding to the plurality of driving elements, wherein one end of each of the plurality of memory cells is coupled to a first end (such as source-drain) of the corresponding driving element; and a plurality of word lines (such as WL0~WLn−1) and a plurality of bit lines (such as BL0~BLm−1), arranged to intersect with each other, wherein each of the plurality of word lines (such as WL1) is respectively coupled to control ends (such as the gates of transistors T10 and T11) of the plurality of driving elements in the same row, and each of the plurality of bit lines is respectively coupled to the other ends of the plurality of memory cells. For each of the plurality of word lines, the first end of one of the plurality of driving elements (such as transistor T10) is connected to the first end of at least one other driving element (such as transistor T11) in the same row by a metal line (such as metal wires). M4), so as to form share driving elements.

Figure 5A:
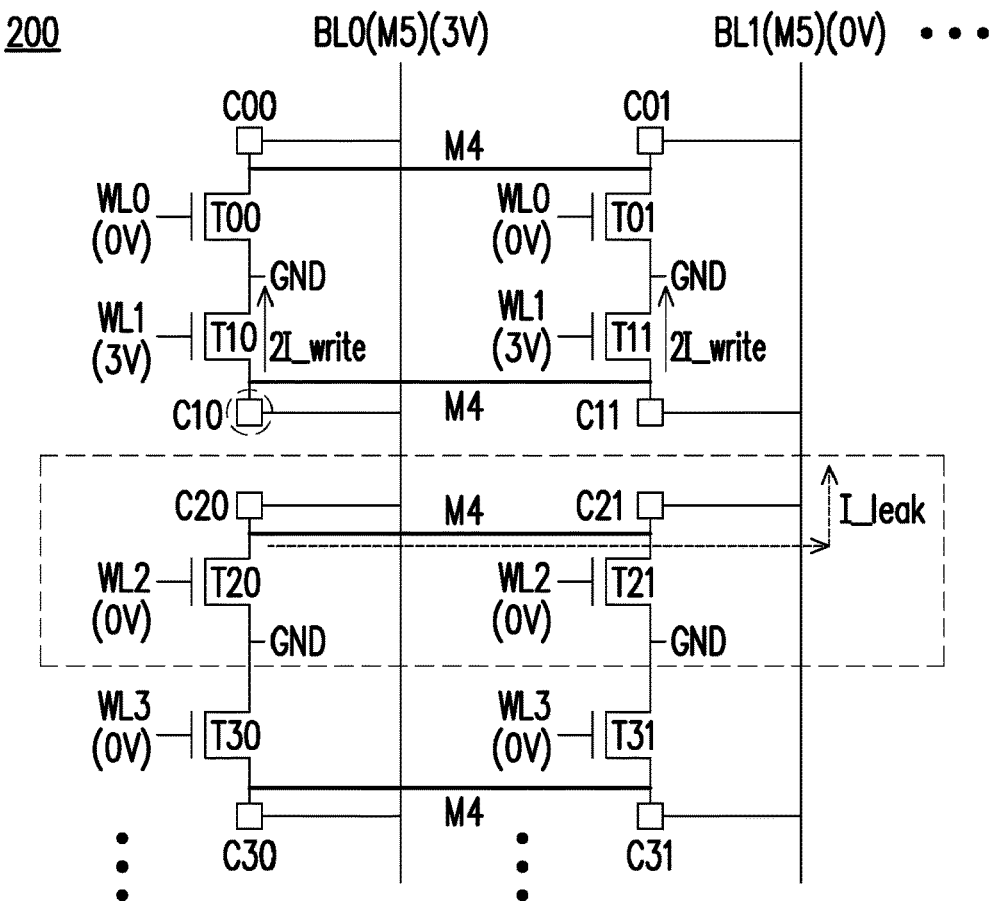
FIGS. 5A and 5B show schematic diagrams for illustrating the occurrence of leakage current.
Figure 5B:
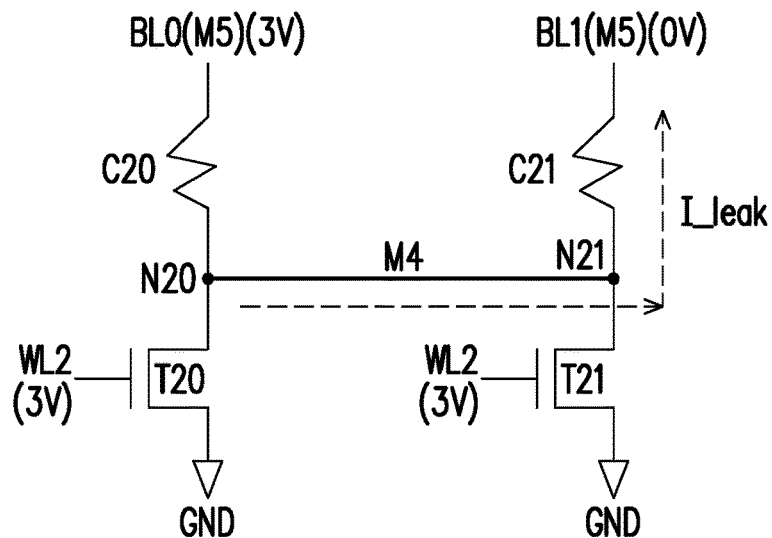

FIGS. 5A and 5B show schematic diagrams for occurrence of leakage current. As shown in FIG. 5A, for the memory cells that are not selected, such as C20, there is a possibility of occurrence for leakage current. For example, although the memory cell C20 is not selected, one end of the memory cell C20 is still coupled to the bit line BL0 to which a voltage of 3V is applied. Since the metal line M4 is connected from one end of the memory cell C20 to one end of the memory cell C21, and the other end of the memory cell C21 is connected to the bit line BL1 to which a voltage of 0V is applied, there will be a voltage difference between the two ends of the metal line M4, resulting in occurrence of leakage current I_leak. As shown in FIG. 5B, the memory cells C20 and C21 and the transistors T20 and T21 on the word line WL2 are picked up as an example to illustrate the leakage current I_leak. As shown in FIG. 5B, one end of the memory cell C20 is coupled to the bit line BL0 and the other end is coupled to one source-drain of the transistor T20, one end of the memory cell C21 is coupled to the bit line BL1 and the other end is coupled to one source-drain of transistor T21. The node N20 between the memory cell C20 and the source-drain of the transistor T20 is also coupled to the node N21 between the memory cell C21 and the source-drain of the transistor T21 via the metal line M4.

At this time, because the word line WL2 is applied with a voltage of 0V, that is, the memory cells C20~C2m−1 on the word line WL2 are not selected, so the transistors T20, T21, etc. are in an off state. However, because one end of the memory cell C20 is coupled to the bit line BL0 to which 3V is applied and one end of the memory cell C21 is coupled to the bit line BL1 to which 0V is applied, therefore, the two ends of the metal line M4 connecting the memory cell C20 and the memory cell C21 will have a voltage difference, resulting in a leakage current path. The leakage current I_leak flows from the node N20 to the memory cell C21 via the metal line M4.

Figure 6A:
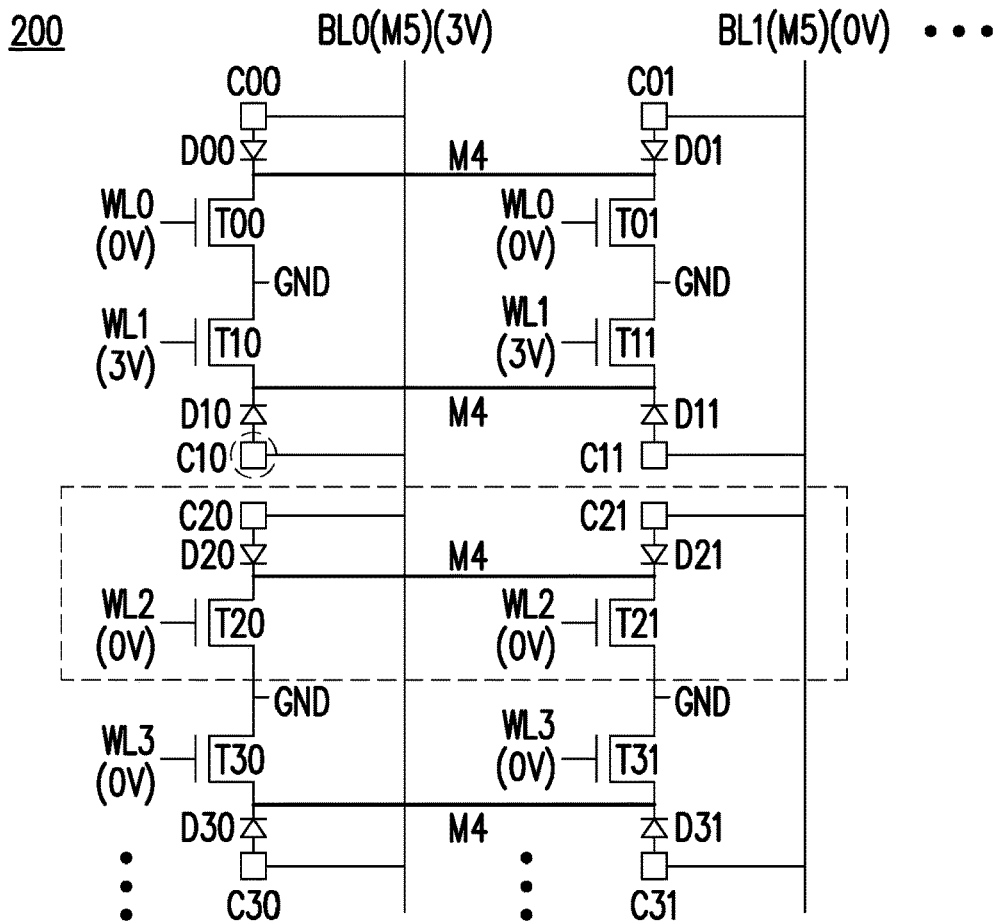
FIGS. 6A and 6B show a phase change memory array with 1T1R configuration that can prevent leakage current.
Figure 6B:
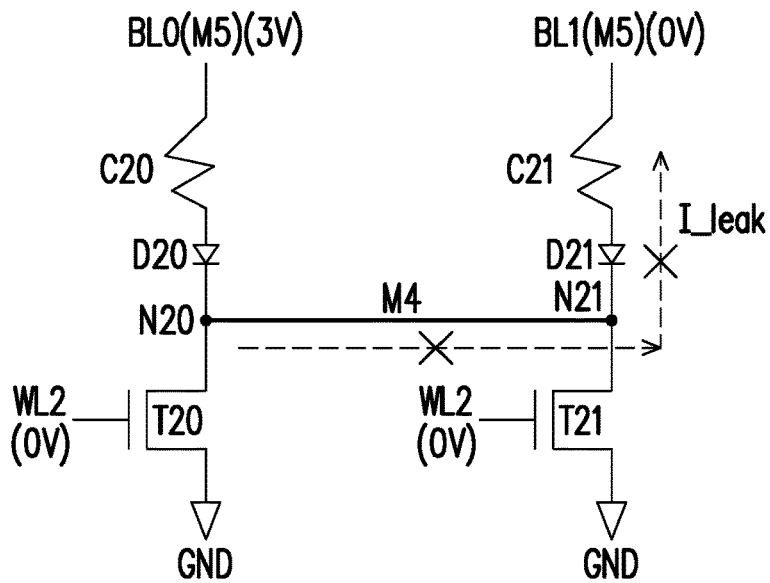

FIGS. 6A and 6B show a phase change memory array with 1T1R configuration that can prevent leakage current. For the leakage current issue, based on the configuration in FIG. 4A, the embodiment can further provide a mechanism to block the leakage current. As shown in FIG. 6A, the phase change memory array 200 further includes a plurality of unidirectional elements Dij, i=0~n−1, j=0~m−1 (n×m). The number of unidirectional elements Dij is basically the same as the number of memory cells Cij. The unidirectional element Dij may be, for example, a diode or any element that configure a transistor to function as a diode.

As shown in FIG. 6A, each diode Dij is coupled between the memory cell Dij and one source-drain of the transistor Tij. In particular, the anode of the diode Dij is coupled to one end of the memory cell Cij, and the cathode is coupled to a source-drain of the transistor Tij, and also one end of the corresponding metal line M4. Here, the metal wire M4 one fourth layer is still taken as an example, not limited thereto. In this exemplary configuration where the adjacent transistors Tij and Tij+1 are used as the share transistors, for example, both ends of each metal line M4 connecting memory cells Cij and Cij+1 are coupled to cathodes of two diodes Dij and Dij+1 respectively.

Next, the operation of the diode Dij will be described. Taking the word line WL2 shown in FIG. 6B as an example, the diode D20 is coupled between the memory cell C20 and the transistor T20, the diode D21 is coupled between the memory cell C21 and the transistor T21, and two ends of the metal line M4 are respectively coupled to the cathodes of diodes D20 and D21. When the writing operation is performed on the memory cell C10, a voltage of 3V is applied to the word line WL1, a voltage of 0V is applied to the other word lines WL0, WL2, . . . , WLn−1, a voltage of 3V is applied to the bit line BL0, and a voltage of 0 v is applied to the other bit lines BL1, BL2, . . . , BLm−1. In this way, the memory cell C10 is selected to be written.

In addition, taking the word line WL2 as an example, because the word line WL2 is applied with a voltage of 0V, the memory cells C20~C2m−1 are not selected, so that the transistors T20, T21, . . . , T2n−1 are in an off state. However, because one end of the memory cell C20 is coupled to the bit line BL0 applied with 3V and one end of the memory cell C21 is coupled to the bit line BL1 applied with 0V, a voltage difference is occurred between the two end of the metal line M4 connecting the memory cell C20 and the memory cell C21. However, because of the existence of a reverse biased diode D21, the current path from the node N20 to the memory cell C21 through the metal line M4 and the node N21 will be cut off. Although there is a voltage difference of 3V on this current path, the diode D21 can block the leakage current I_leak from flowing to the memory cell C21. Therefore, by providing the unidirectional element Dij, the leakage current can be effectively prevented.

Figure 7:
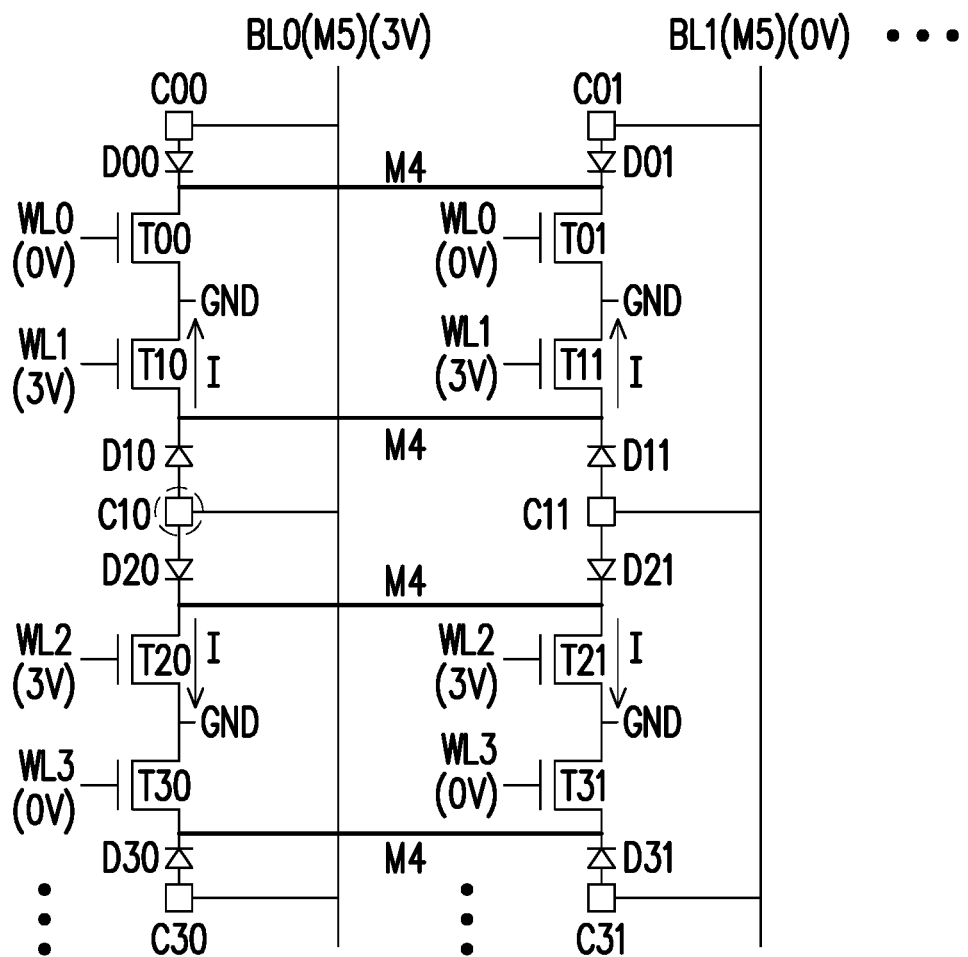
FIG. 7 shows a schematic diagram of a phase change memory array with 2T1R configuration according to the embodiment of the disclosure.

FIG. 7 shows a schematic diagram of a writing operation of a phase change memory array with a 2T1R configuration according to an embodiment of the disclosure. In the above description, the 1T1R configuration is used to describe the embodiment of the present disclosure, but the technical concepts and means of the embodiment of the present disclosure can also be applied to the 2T1R configuration. As shown in FIG. 7, for example, the transistors (driving element) for the memory cell C10 are the transistors T10 and T20, and the corresponding share transistors are T11 and T21. The metal lines M4 is also coupled to the node between the memory cell and the transistor to the node between another memory cell and its corresponding transistor, thereby facilitating the effect of the share transistor.

Take the memory cell C10 as an example, when the writing operation is performed on the memory cell C10, the word lines WL1 and WL2 are applied with a voltage of 3V, the bit line BL0 is applied with a voltage of 3V and the bit line BL1 is applied with a voltage of 0V, or 0.5V to inhibit the bit line, or in a floating state. In this way, the writing operation is performed on the memory cell C10. At this time, through the metal line M4 that connects the source-drains of the transistors T10 and T11 and the metal line M4 that connects the source-drains of the transistors T20 and T21, the transistors T10, T11, T20, T21 become share transistors, and the write current for the memory cell C10 can be further increased.

In addition, as described in FIGS. 6A and 6B above, generally, a unidirectional element Dij such as a diode can be provided between the memory cell Cij and the metal line M4, so that the effect of preventing leakage current can also be achieved.

In summary, the present disclosure utilizes the concept of share driving elements (such as transistors) for the memory cell, which utilizes any layer of metal lines in the interconnection under the memory cells to connect the transistors in parallel. In this way, there is no need to increase the size of the transistor, nor the size of the memory cell, nor the size of the overall memory array, so that a higher write current can be provided to the memory cell.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory array, comprising:
   a plurality of driving elements, arranged in an array with a plurality of rows and a plurality of columns;
   a plurality of memory cells, arranged in an array with a plurality of rows and a plurality of columns and respectively corresponding to the plurality of driving elements, wherein one end of each of the plurality of memory cells is coupled to a first end of the corresponding driving element; and
   a plurality of word lines and a plurality of bit lines, arranged to intersect with each other, wherein each of the plurality of word lines is respectively coupled to control ends of the plurality of driving elements in the same row, and each of the plurality of bit lines is respectively coupled to the other ends of the plurality of memory cells; wherein for each of the plurality of word lines, the first end of one of the plurality of driving elements is connected to the first end of at least one other driving element in the same row by a metal line, so as to form share driving elements.

2. The memory array according to claim 1, wherein the metal line is one of metal lines in an interconnection between the memory cell and the first end of the corresponding driving element.

3. The memory array according to claim 1, wherein the driving elements of the share driving elements are adjacent.

4. The memory array according to claim 1, wherein a second end of each of the plurality of driving elements is grounded.

5. The memory array according to claim 1, wherein each of the plurality of driving elements is a metal oxide semiconductor transistor, and the first end and the second end are the first and second source-drains, and the control end is a gate.

6. The memory array described in claim 1, further comprising:
a plurality of unidirectional elements corresponding to the plurality of memory cells, and each of the plurality of unidirectional elements is coupled between the other end of the corresponding memory cell and the first end of the corresponding driving element.

7. The memory array described in claim 6, wherein the plurality of unidirectional elements are diodes, an anode of the diode is coupled to the other end of the corresponding memory cell, and a cathode of the diode is coupled to the first end of the corresponding driving element.

8. The memory array according to claim 1, wherein each of the memory cells is a variable resistance element made of a phase change material.

9. The memory array according to claim 1, wherein each of the plurality of memory cells is driven by the driving elements in the same column on two adjacent word lines.

10. A memory structure, comprising:
a first driving element and a second driving element, located on a substrate;
a word line, connecting a first control end of the first driving element and a second control end of the second driving element;
a first memory cell and a second memory cell, respectively located above the first driving element and the second driving element;
a first interconnection, located between the substrate and the first memory cell, and connected to a first end of the first driving element and the first memory cell; and
a second interconnection, located between the substrate and the second memory cell, and connected to a first end of the second driving element and the second memory cell, wherein the first interconnection is connected to the second interconnection, a second end of the first driving element and a second end of the second driving element are grounded, wherein one of metal lines of the first interconnection is electrically connected to one of metal lines of the second interconnection.

11. The memory structure according to claim 10, wherein the first interconnection and the second interconnection are connected by the metal line on the same layer.

12. The memory structure according to claim 10, wherein the metal line of the first interconnection closest to the first memory cell is connected to the metal line of the second interconnection line closest to the second memory cell.

13. The memory structure according to claim 10, further comprising a first bit line and a second bit line located on the first memory cell and the second cell, respectively, and respectively connected to the first memory cell and the second memory cell.

14. The memory structure according to claim 10, further comprising:
a first unidirectional element, coupled between the first memory cell and the metal line connecting the first interconnection and the second interconnection; and
a second unidirectional element, coupled between the second memory cell and the metal line connecting the first interconnection and the second interconnection.

15. The memory structure according to claim 14, wherein the first and second unidirectional elements are diodes.

16. The memory structure according to claim 10, wherein the first and second memory cells are variable resistance elements made of phase change materials.

17. The memory structure according to claim 10, wherein the first and second driving elements are metal oxide semiconductor transistors, and the first ends and the second ends of the first and second driving elements are source-drains, and the control ends of the first and second driving elements are gates.

* * * * *